(12) United States Patent
Nakano et al.

(10) Patent No.: US 9,508,803 B2
(45) Date of Patent: Nov. 29, 2016

(54) SEMICONDUCTOR DEVICE AND METHOD FOR PRODUCING SEMICONDUCTOR DEVICE

(71) Applicant: ROHM CO., LTD., Kyoto-shi, Kyoto (JP)

(72) Inventors: Yuki Nakano, Kyoto (JP); Ryota Nakamura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 82 days.

(21) Appl. No.: 14/400,101

(22) PCT Filed: May 10, 2013

(86) PCT No.: PCT/JP2013/063160
§ 371 (c)(1),
(2) Date: Nov. 10, 2014

(87) PCT Pub. No.: WO2013/168796
PCT Pub. Date: Nov. 14, 2013

(65) Prior Publication Data
US 2015/0123148 A1    May 7, 2015

(30) Foreign Application Priority Data

May 11, 2012    (JP) .................................. 2012-109950

(51) Int. Cl.
*H01L 29/78*    (2006.01)
*H01L 21/336*    (2006.01)
(Continued)

(52) U.S. Cl.
CPC ......... *H01L 29/1608* (2013.01); *H01L 21/283* (2013.01); *H01L 24/05* (2013.01);
(Continued)

(58) Field of Classification Search
CPC .......... H01L 29/7813; H01L 29/1608; H01L 29/7802; H01L 29/1095; H01L 29/7397; H01L 29/7395; H01L 2224/05558
See application file for complete search history.

(56) References Cited

U.S. PATENT DOCUMENTS 5,200,635 A    4/1993  Kaga et al.
8,653,590 B2 *  2/2014  Frisina .................. H01L 21/046
                                                        257/331

(Continued)

FOREIGN PATENT DOCUMENTS

JP    57-192079 A    11/1982
JP    2-90620 A       3/1990

(Continued)

OTHER PUBLICATIONS

International Preliminary Report on Patentability and Written Opinion; PCT/JP2013/063160 (10 pages).

*Primary Examiner* — Marvin Payen
*Assistant Examiner* — Jeremy Joy
(74) *Attorney, Agent, or Firm* — Hamre, Schumann, Mueller & Larson, P.C.

(57) ABSTRACT

[Problem] To provide a semiconductor device in which the surface of a metal electrode arranged on the outermost surface can be made flat or smooth, and a method for producing said semiconductor device.
[Solution] This semiconductor device (1) comprises: an SiC epitaxial layer (3) that has an uneven shape formed, on the basis of a height difference ($H_1$), on the outermost surface where a semiconductor element (MOSFET) is arranged; and a source electrode (13) made of a metal material and formed on the SiC epitaxial layer (3). A polysilicon layer (12) having a surface (121) that is smoother than said uneven shape is provided between the surface (31) of the SiC epitaxial layer (3) and the source electrode (13).

15 Claims, 9 Drawing Sheets

(51) Int. Cl.

| | | |
|---|---|---|
| *H01L 29/06* | (2006.01) | |
| *H01L 29/40* | (2006.01) | |
| *H01L 29/16* | (2006.01) | |
| *H01L 29/45* | (2006.01) | |
| *H01L 29/66* | (2006.01) | |
| *H01L 23/00* | (2006.01) | |
| *H01L 21/283* | (2006.01) | |
| H01L 29/10 | (2006.01) | |
| H01L 29/808 | (2006.01) | |
| H01L 29/417 | (2006.01) | |
| H01L 29/739 | (2006.01) | |
| H01L 23/495 | (2006.01) | |
| H01L 25/18 | (2006.01) | |

(52) U.S. Cl.
CPC ........ *H01L 29/45* (2013.01); *H01L 29/66068* (2013.01); *H01L 29/7802* (2013.01); *H01L 29/7813* (2013.01); *H01L 29/7827* (2013.01); H01L 23/49562 (2013.01); H01L 23/49575 (2013.01); H01L 24/06 (2013.01); H01L 24/48 (2013.01); H01L 24/49 (2013.01); H01L 25/18 (2013.01); H01L 29/1095 (2013.01); H01L 29/41766 (2013.01); H01L 29/7395 (2013.01); H01L 29/7397 (2013.01); H01L 29/8083 (2013.01); H01L 2224/04042 (2013.01); H01L 2224/05624 (2013.01); H01L 2224/0603 (2013.01); H01L 2224/48139 (2013.01); H01L 2224/48247 (2013.01); H01L 2224/48463 (2013.01); H01L 2224/85375 (2013.01); H01L 2924/00014 (2013.01); H01L 2924/12032 (2013.01); H01L 2924/12036 (2013.01); H01L 2924/1305 (2013.01); H01L 2924/1306 (2013.01); H01L 2924/13055 (2013.01); H01L 2924/13062 (2013.01); H01L 2924/13091 (2013.01); H01L 2924/181 (2013.01)

(56) References Cited

U.S. PATENT DOCUMENTS

| | | | |
|---|---|---|---|
| 2004/0191996 A1* | 9/2004 | Takaishi | H01L 29/7813 438/270 |
| 2009/0114982 A1* | 5/2009 | Saka | H01L 29/4236 257/330 |
| 2009/0121349 A1 | 5/2009 | Suzuki | |
| 2009/0278169 A1* | 11/2009 | Hayashi | H01L 21/046 257/183 |
| 2010/0193799 A1* | 8/2010 | Nakano | H01L 29/1608 257/77 |
| 2011/0095302 A1* | 4/2011 | Hikichi | H01L 29/456 257/77 |
| 2011/0298048 A1 | 12/2011 | Senoo et al. | |

FOREIGN PATENT DOCUMENTS

| | | | |
|---|---|---|---|
| JP | 4-14870 A | | 1/1992 |
| JP | 4-307942 | | 10/1992 |
| JP | 8-213453 A | | 8/1996 |
| JP | 08213453 A | * | 8/1996 |
| JP | 2008-98593 | | 4/2008 |
| JP | 2009-117761 A | | 5/2009 |
| JP | 2011-146429 | | 7/2011 |
| WO | 2010/092691 A1 | | 8/2010 |

* cited by examiner

FIG. 2
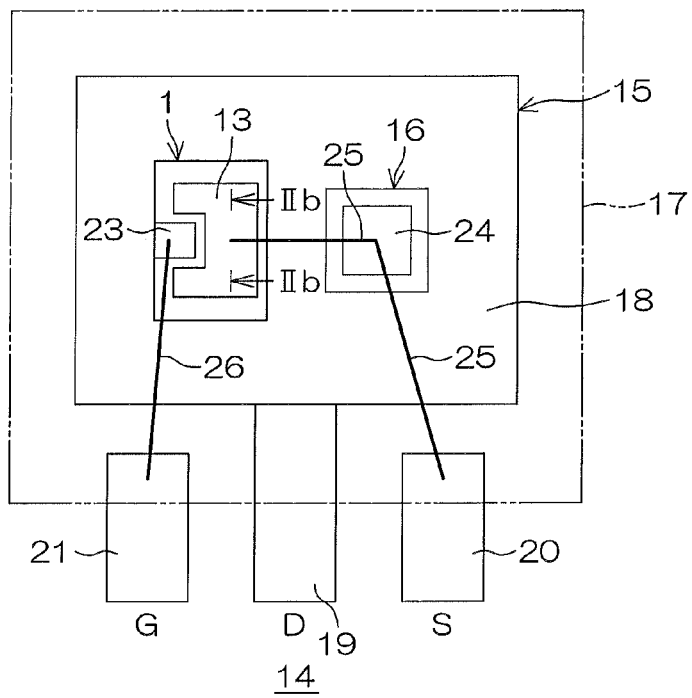
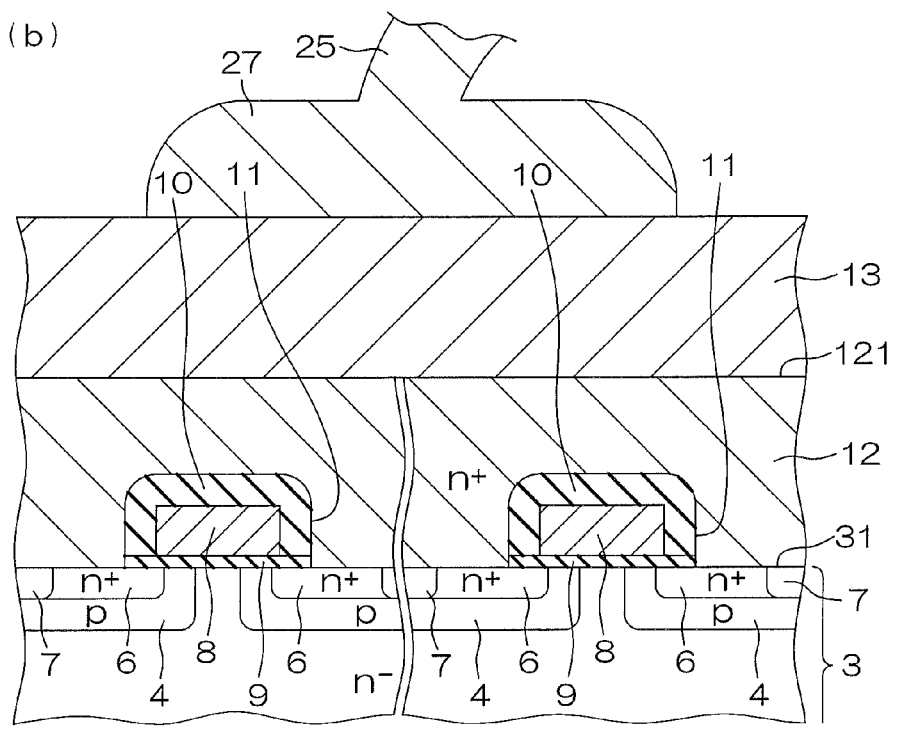

1

SEMICONDUCTOR DEVICE AND METHOD FOR PRODUCING SEMICONDUCTOR DEVICE

TECHNICAL FIELD

The present invention relates to a semiconductor device and a method for producing the same.

BACKGROUND ART

For example, Patent Document 1 discloses a semiconductor device including a semiconductor substrate, a drift region formed in the semiconductor substrate, an n column region and a p column region alternatingly formed in the drift region, a p well region formed at an upper end in the drift region, a pair of n-type source regions formed in the p well region, a $p^+$ body contact region formed in a manner linking the pair of n-type source regions, a gate electrode formed via agate insulating film on a device surface of the semiconductor substrate, an interlayer film that covers the gate electrode, and a source metal electrode layer formed via a barrier metal layer on the interlayer film.

CITATION LIST

Patent Literature

Patent Document 1: Japanese Patent Application Publication No. 2011-146429

SUMMARY OF INVENTION

Technical Problem

A semiconductor device according to a first aspect of the present invention includes a semiconductor layer having an uneven shape on a topmost surface on which a semiconductor element is disposed, an unevenness buffer layer over the uneven shape that has a smoother surface than the uneven shape, and a surface electrode made of a metal material formed on the unevenness buffer layer (Aspect 1).

According to the arrangement, the unevenness buffer layer is formed, and therefore, it is possible to make the surface of the surface electrode smoother or flatter than a case where the metal material is directly deposited on the topmost surface (uneven shape) of the semiconductor layer to form the surface electrode. Thus, when a wire is connected to the surface electrode, the wire being caught on the surface of the surface electrode is eliminated, and it is thus possible to expand a wire connection portion to the entire surface of the surface electrode. As a result, it is possible to increase an area where the wire contacts the surface electrode, and therefore, it is possible to improve the adhesion of a wire. As a result, it is possible to reduce a frequency of the wire being stripped off, and therefore, it is possible to improve a yield when the semiconductor device is assembled, resulting in reduction in cost. The improvement in the wire's adhesion enables improvement in reliability of the wire connection portion.

It may be possible that the uneven shape is formed on the basis of a height difference between a surface of an insulating film formed on the surface of the semiconductor and having a contact hole allowing the surface to be selectively exposed and the surface of the semiconductor layer exposed to the contact hole (Aspect 2). The uneven shape may be formed on the basis of a height difference between a bottom surface of a trench formed toward a back surface from the surface of the semiconductor layer and the surface of the semiconductor layer (Aspect 3).

It is preferable that the unevenness buffer layer includes a polysilicon layer (Aspect 4).

A polysilicon is a material having an excellent embeddability, and therefore, it is possible to easily backfill a recess of the uneven shape. Thus, it is possible to make the surface of the surface electrode smooth or flat with an easy method, that is, depositing the polysilicon.

It is preferable that a thickness T of the polysilicon layer is ⅔ or more of a maximum width W of the recess of the uneven shape (Aspect 5).

When the polysilicon is deposited to reach the thickness T that satisfies the condition, it is possible to reliably backfill the recess of the uneven shape.

When the semiconductor layer includes an SiC layer in which a first conductive-type impurity region is selectively formed, it is preferable that the polysilicon layer selectively includes a first conductive-type portion contacting the first conductive-type impurity region (Aspect 6).

A first conductive-type polysilicon is a substance capable of contacting a first conductive-type SiC with a low contact resistance. Therefore, it is possible to easily form an ohmic junction between the SiC layer (first conductive-type impurity region) and the polysilicon layer (first conductive-type portion) without forming silicide on the surface of the SiC layer after performing a treatment such as RTA (Rapid Thermal Anneal).

When the SiC layer further includes a selectively formed second conductive-type impurity region, it is preferable that the polysilicon layer selectively further includes a second conductive-type portion contacting the second conductive-type impurity region (Aspect 7).

A second conductive-type polysilicon is a substance capable of contacting a second conductive-type SiC with a low contact resistance. Thus, it is possible to easily form an ohmic junction between the SiC layer (second conductive-type impurity region) and the polysilicon layer (second conductive-type portion) without a need for forming silicide on the surface of the SiC layer after performing a treatment such as RTA (Rapid Thermal Anneal).

A semiconductor device according to a second aspect of the present invention includes a semiconductor layer made of first conductive-type SiC, a first conductive-type source layer formed in a manner to be exposed to the surface of the semiconductor layer, a second conductive-type channel layer formed in a manner contacting the source layer, at a back surface side of the semiconductor layer relative to the source layer, a first conductive-type drift layer formed in a manner contacting the channel layer, at a back surface side of the semiconductor layer relative to the channel layer, an interlayer film having a contact hole that is formed on the surface of the semiconductor layer and that allows the source layer to be selectively exposed, a polysilicon layer that is formed on the interlayer film and that selectively contacts the source layer via the contact hole, the polysilicon layer having a smoother surface than an uneven shape formed on the basis of a height difference between the surface of the interlayer film and the surface of the semiconductor layer exposed to the contact hole, and a source electrode including a metal material formed on the polysilicon layer (Aspect 8).

According to the arrangement, the polysilicon layer is formed between the source electrode including a metal material and the semiconductor layer, and therefore, it is possible to make the surface of the source electrode smoother or flatter than a case where the metal material is directly deposited on the topmost surface (uneven shape) of the semiconductor layer to form the source electrode. Thus, when a wire is connected to the source electrode, the wire being caught on the surface of the source electrode is eliminated, and it is thus possible to expand a wire connection portion to the entire surface of the source electrode. As a result, it is possible to increase an area where the wire contacts the source electrode, and therefore, it is possible to improve the adhesion of a wire. As a result, it is possible to reduce a frequency of the wire being stripped off, and therefore, it is possible to improve a yield when the semiconductor device is assembled, resulting in reduction in cost. The improvement in the wire's adhesion enables improvement in reliability of the wire connection portion.

A polysilicon is a material having an excellent embeddability, and therefore, it is possible to easily backfill the contact hole in the interlayer film. Thus, it is possible to make the surface of the source electrode smooth or flat with an easy method, that is, depositing the polysilicon.

It is preferable that the polysilicon layer selectively includes a first conductive-type portion contacting the source layer (Aspect 9).

A first conductive-type polysilicon is a substance capable of contacting a first conductive-type SiC with a low contact resistance. Therefore, it is possible to easily form an ohmic junction between the source layer and the polysilicon layer (first conductive-type portion) without forming silicide on the surface of the SiC layer by performing a treatment such as RTA (Rapid Thermal Anneal).

It is preferable that the channel layer includes a second conductive-type channel contact layer that is exposed to the surface of the semiconductor layer and that is higher in concentration than other portions in the channel layer, and the polysilicon layer further includes a second conductive-type portion contacting the channel contact layer (Aspect 10).

A second conductive-type polysilicon is a substance capable of contacting a second conductive-type SiC with a low contact resistance. Therefore, it is possible to easily form an ohmic junction between the channel contact layer and the polysilicon layer (second conductive-type portion) without forming silicide on the surface of the SiC layer by performing a treatment such as RTA (Rapid Thermal Anneal).

The semiconductor device may include a trench gate type structure including a gate trench that penetrates through the source layer and the channel layer from the surface of the semiconductor layer to reach the drift layer, a gate insulating film formed on a side surface and a bottom surface of the gate trench, and a gate electrode embedded in the gate trench (Aspect 11). The semiconductor device may include a planar gate type structure including a gate insulating film formed on the surface of the semiconductor layer and a gate electrode formed on the gate insulating film (Aspect 12).

The semiconductor device may further include a source trench that penetrates through the source layer and the channel layer from the surface of the semiconductor layer to reach the drift layer, and the uneven shape may include unevenness formed on the basis of a height difference between a bottom surface of the source trench and the surface of the semiconductor layer (Aspect 13). Also in this case, it is possible to easily backfill the source trench by the polysilicon.

A method of manufacturing a semiconductor device according to a first aspect of the present invention includes a step of forming a semiconductor element by selectively forming a predetermined impurity layer on a surface of a semiconductor layer, a step of forming an insulating film on the surface of the semiconductor layer, a step of forming a contact hole allowing the impurity layer to be exposed by selectively removing the insulating film, a step of forming a polysilicon layer by backfilling the contact hole and depositing polysilicon until the deposited surface is smoother than an uneven shape formed on the basis of a height difference between the surface of the insulating film and the surface of the semiconductor layer exposed to the contact hole, and a step of forming a surface electrode by depositing a metal material on the polysilicon layer (Aspect 14).

According to the method, the polysilicon having an excellent embeddability is deposited on the semiconductor layer, and therefore, it is possible to easily backfill the contact hole. Thus, it is possible to easily make the surface of the surface electrode smooth or flat.

It is preferable that the step of forming the surface electrode includes a step of depositing the metal material on the polysilicon layer left unprocessed after being deposited, without performing a flattening process on the deposited surface of the polysilicon layer (Aspect 15).

In this method, it is possible to omit the flattening process, and therefore, it is possible to simplify the manufacturing process. In addition, when the flattening process such as etch back is performed on the polysilicon, the unevenness may occur on the etched-back surface due to crystallinity, however, it is possible to prevent the occurrence of such an unevenness.

It is preferable that the step of forming the polysilicon layer includes a step of depositing polysilicon by an LPCVD method (Aspect 16).

When the polysilicon is deposited by the LPCVD method, it is possible to form a film evenly over all the surfaces including the bottom surface and the side surface of the contact hole.

BRIEF DESCRIPTION OF DRAWINGS

FIGS. 2 (*a*) and 2 (*b*) are each views for describing the arrangement of a semiconductor package including the semiconductor device, where FIG. 2 (*a*) is a transparent view of an inside of a package and FIG. 2 (*b*) is a cross-sectional view taken along a cutting plane line IIb-IIb in FIG. 2 (*a*).

DETAILED DESCRIPTION OF EMBODIMENTS

Embodiments of the present invention will hereinafter be described in detail with reference to the accompanying drawings.

Figure 1:
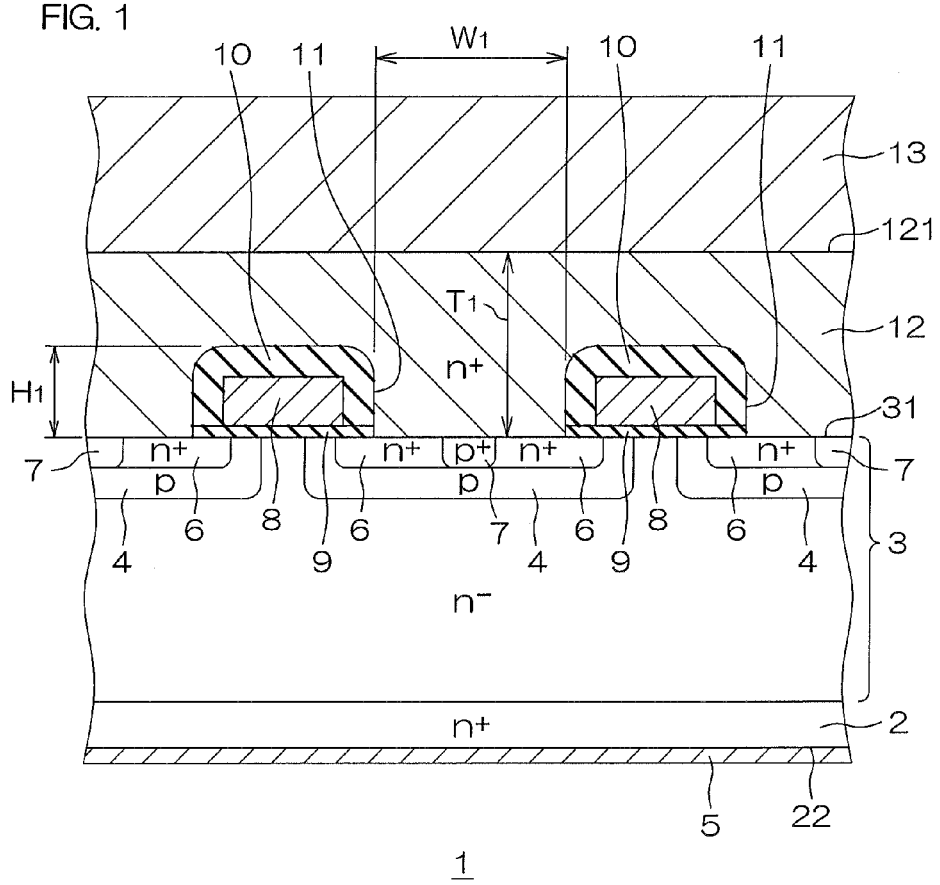
FIG. 1 is a schematic cross-sectional view of a semiconductor device according to a first embodiment of the present invention.

FIG. 1 is a schematic cross-sectional view of a semiconductor device according to a first embodiment of the present invention.

A semiconductor device 1 includes a power MOSFET (Metal-Oxide-Semiconductor Field Effect Transistor) element (semiconductor element) using SiC (silicon carbide). The semiconductor device 1 includes, as an example of a semiconductor layer, an SiC substrate 2 and an SiC epitaxial layer 3 formed on the SiC substrate 2. Either conductive type of the SiC substrate 2 or the SiC epitaxial layer 3 is an n type, as a first conductive type. Specifically, the SiC substrate 2 is of type (the concentration is $1\times10^{18}$ to $1\times10^{21}$ cm$^{-3}$, for example), and the SiC epitaxial layer 3 is of n type (the concentration is $1\times10^{15}$ to $1\times10^{17}$ cm$^{-3}$, for example) lower in concentration than the SiC substrate 2. The SiC epitaxial layer 3 is configured to function as a drain region (drift layer) of the field effect transistor.

On a surface 31 side of the SiC epitaxial layer 3, a plurality of p-type wells 4, as an example of a channel layer, are formed in a large number to be arrayed in lattice. On a back surface 22 of the SiC substrate 2, a drain electrode 5 made of, for example, a nickel metal film is formed.

Within each of the p-type wells 4, a first conductive-type impurity region and an n$^+$-type source region 6 as an example of a source layer, and a second conductive-type impurity region and a p$^+$-type well contact region 7 as an example of a channel contact layer, which are surrounded by the n$^+$-type source region 6, are formed. The n$^+$-type source region 6 and the p$^+$-type well contact region 7 are both exposed to the surface 31 of the SiC epitaxial layer 3. A gate electrode 8 is formed in a manner crossing over the adjacent p-type well 4, and between the gate electrode 8 and the SiC epitaxial layer 3, a gate insulating film 9 is interposed. The gate electrode 8 crosses over the n$^+$-type source region 6 and the SiC epitaxial layer 3 for acting as a drain region (region between the p-type wells 4), and is configured to control the formation of an inversion layer (channel) on the surface of the p-type wells 4. That is, the semiconductor device 1 includes a so-called planar gate type structured MISFET (Metal Insulator Semiconductor Field Effect Transistor).

An interlayer film 10, as an example of an insulating film, made of silicon oxide, for example, is formed to cover the gate electrode 8. In the interlayer film 10, a contact hole 11 is selectively formed in a central region of the p-type well 4. The contact hole 11 is formed in a region capable of selectively exposing a portion of the p$^+$-type well contact region 7 and the n$^+$-type source region 6 therearound. Thus, when the surface 31 (flat surface) of the SiC epitaxial layer 3 is covered with the interlayer film 10 having the contact hole 11, on the topmost surface of the semiconductor device 1, an uneven shape is formed which is based on a height difference $H_1$ between the surface of the interlayer film 10 and the surface 31 of the SiC epitaxial layer 3 exposed to the contact hole 11. It should be noted that the "topmost surface" is a concept different from the flat surface 31 of the SiC epitaxial layer 3 (surface of a semiconductor portion), and includes a portion protruded and elevated as a result of the gate electrode 8, the interlayer film 10, etc., being selectively formed on the surface 31.

A polysilicon layer 12 as an example of an unevenness buffer layer is formed to enter into the contact hole 11. The polysilicon layer 12 backfills the contact hole 11, and is formed with a thickness $T_1$ by which the interlayer film 10 is hidden. It is preferable that the specific thickness $T_1$ is ⅔ or more of a maximum width $W_1$ of the contact hole 11. It should be noted that in the embodiment, the contact hole 11 is formed with a constant diameter in a depth direction, and therefore, when the maximum width $W_1$ is measured, the contact hole 11 may be measured at any particular depth position. In the present embodiment, the polysilicon layer 12 uniquely is of n$^+$ type, and within the contact hole 11, is collectively connected to the n$^+$-type source region 6 and the p$^+$-type well contact region 7. The polysilicon layer 12 includes a flat surface 121. Any surface 121 may be acceptable as long as it is smoother than the uneven shape based on the height difference $H_1$. For example, it may be possible that a recessed portion shallower than the height difference $H_1$ is selectively formed in the surface 121 and a minute uneven shape is formed by the recessed portion.

In the surface 121 of the polysilicon layer 12, a source electrode 13 (made of a metal material such as aluminum) as an example of a surface electrode is formed. The source electrode 13 is electrically connected via the polysilicon layer 12 to the n$^+$-type source region 6 and the p$^+$-type well contact region 7. Therefore, the n$^+$-type source region 6 is the same in electrical potential as the source electrode 13. The p-type well 4 is connected via the p$^+$-type well contact region 7 to the source electrode 13, and therefore, is the same in electrical potential as the source electrode 13.

FIGS. 2 (a), and 2 (b) are each views for describing the arrangement of a semiconductor package including the semiconductor device, where FIG. 2 (a) is a transparent view of an inside of a package and FIG. 2 (b) is a cross-sectional view taken along a cutting plane line IIb-IIb in FIG. 2 (a). It should be noted that in FIG. 2 (b), for the sake of clarification, a portion immediately below the source electrode 13 is selectively enlarged and shown.

A semiconductor package 14 includes a terminal frame 15, the semiconductor device 1, a Schottky barrier diode 16, and a resin package 17.

The terminal frame 15 is formed to have a plate shape made of metal. The terminal frame 15 includes a base portion 18, a drain terminal 19 formed integrally with the base portion 18, and a source terminal 20 and a gate terminal 21 formed separately of the base portion 18.

In the base portion 18, the semiconductor device 1 and the Schottky barrier diode 16 are disposed with an interval therebetween. The semiconductor device 1 is placed in the base portion 18 in a posture that the topmost surface faces upward. When placed, to the topmost surface of the semiconductor device 1, the source electrode 13 and a gate pad 23 electrically connected to the gate electrode 8 are exposed. On the other hand, to the topmost surface of the Schottky barrier diode 16, an anode electrode 24 is exposed.

The drain terminal 19, the source terminal 20, and the gate terminal 21 are each formed in a linear shape, in a plane view, having one end and the other end, and the gate terminal 21, the drain terminal 19, and the source terminal 20 are disposed, in this order, parallel to one another. The drain terminal 19 is disposed between the gate terminal 21 and the source terminal 20.

The drain electrode 5 of the semiconductor device 1 and a cathode electrode (not shown) of the Schottky barrier diode 16 are, in contact with the base portion 18, electrically connected to the drain terminal 19. The source electrode 13 of the semiconductor device 1 and the anode electrode 24 of the Schottky barrier diode 16 are electrically connected to the source terminal 20 by using a common wire 25. The gate pad 23 of the semiconductor device 1 is electrically connected to the gate terminal 21 by using a wire 26.

The resin package 17 is made of a well-known mold resin such as epoxy resin, and seals, together with the semiconductor device 1 and the Schottky barrier diode 16, the base portion 18 and the wires 25 and 26. The three terminals (the drain terminal 19, the source terminal 20, and the gate terminal 21) are selectively exposed from the resin package 17.

Figure 3:
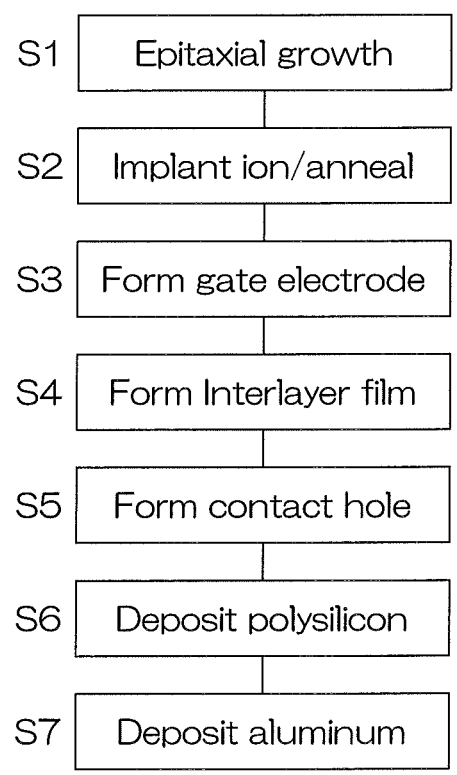
FIG. 3 is a flowchart for describing a method of manufacturing the semiconductor device.

FIG. 3 is a flowchart for describing the method of manufacturing a semiconductor device.

By using an epitaxial growth method such as a CVD (Chemical Vapor Deposition) method, an LPE (Liquid Phase Epitaxy) method, and an MBE (Molecular Beam Epitaxy) method, an SiC crystal is grown on the SiC substrate 2 etc., while doping an impurity thereon (step S1). Thus, the SiC epitaxial layer 3 is formed on the SiC substrate 2. Next, the impurity is selectively implanted in the surface 31 of the SiC epitaxial layer 3 to perform an annealing treatment (step S2). Thus, the p-type well 4, the $n^+$-type source region 6, and the $p^+$-type well contact region 7 are formed. Next, the surface 31 of the SiC epitaxial layer 3 is thermally oxidized to thereby form the gate insulating film 9, and the gate electrode 8 having a predetermined pattern is formed on the gate insulating film 9 (step S3). Next, by the CVD method, the interlayer film 10 is formed on the SiC epitaxial layer 3 (step S4).

A next step is to form the contact hole 11 (step S5). Specifically, by a well-known patterning technology, the interlayer film 10 and the gate insulating film 9 are selectively removed continuously. Thus, the contact hole 11 that penetrates through the interlayer film 10 and the gate insulating film 9 is formed, and at the same time, on the topmost surface of the SiC epitaxial layer 3, an uneven shape is formed which is based on the height difference $H_1$ between the surface of the interlayer film 10 and the surface 31 of the SiC epitaxial layer 3 exposed to the contact hole 11.

Next, by an LPCVD (Low Pressure Chemical Vapor Deposition) method, the contact hole 11 is backfilled, and the polysilicon is deposited without introducing the impurity until the deposited surface (surface 121) becomes smoother than the uneven shape based on the height difference $H_1$ (step S6). When the polysilicon is deposited by the LPCVD method, it is possible to form a film evenly over all the surfaces including the bottom surface and the side surface of the contact hole 11.

Specifically, the polysilicon is deposited to reach the height of ⅔ or more of the maximum width $W_1$ of the contact hole 11. When the polysilicon is deposited to reach the height (thickness $T_1$) that satisfies the condition, it is possible to reliably backfill the contact hole 11.

Thereafter, an n-type impurity is implanted, without a mask, to the entire deposited polysilicon. Thus, the polysilicon layer 12 of $n^+$ type is formed.

Next, a flattening process such as etch back is not performed on the deposited surface (surface 121) of the polysilicon layer 12, but by using a sputtering method and an evaporation method, the metal material such as aluminum is deposited on the surface 121 of the polysilicon layer 12 left unprocessed after being deposited (step S7). Thus, the source electrode 13 is formed. Thereafter, when the drain electrode 5, etc., are formed, the semiconductor device 1 as shown in FIG. 1 is obtained.

According to the above-described method, even when on the topmost surface of the SiC epitaxial layer 3, an uneven shape is formed which is based on the height difference $H_1$, if the polysilicon having an excellent embeddability is deposited before the formation of the source electrode 13 (step S6), then it is possible to easily backfill the contact hole 11. Thus, it is possible to make the topmost surface (uneven shape) of the SiC epitaxial layer 3 flat or smooth. Thus, it is possible to easily make the surface of the source electrode 13 smoother or flatter than a case where the metal material is directly deposited on the topmost surface of the SiC epitaxial layer 3 to form the source electrode 13.

Thus, as shown in FIGS. 2 (*a*) and 2 (*b*), when the wire 25 is connected to the source electrode 13, the wire 25 being caught on the surface of the source electrode 13 is eliminated, and it is thus possible to expand a wire connection portion 27 to the entire surface of the source electrode 13. As a result, it is possible to increase an area where the wire 25 contacts the source electrode 13, and therefore, it is possible to improve the adhesion of the wire 25. Thus, it is possible to reduce a frequency of the wire 25 being stripped off, and therefore, it is possible to improve a yield when the semiconductor device 1 is assembled, resulting in reduction in cost. The improvement in adhesion of the wire 25 enables improvement in reliability of the wire connection portion 27.

The n-type polysilicon is a substance capable of contacting n-type SiC with a low contact resistance. Therefore, it is possible to easily form an ohmic junction between the $n^+$-type source region 6 and the polysilicon layer 12 without forming silicide on the surface of the SiC epitaxial layer 3 ($n^+$-type source region 6) by performing a treatment such as RTA (Rapid Thermal Anneal).

In the method according to the embodiment, it is possible to omit the flattening process after the deposition of the polysilicon, and therefore, it is possible to simplify the manufacturing process. In addition, when the flattening process such as etch back is performed on the polysilicon, the unevenness may occur on the etched-back surface due to crystallinity, however, it is possible to prevent the occurrence of such an unevenness. It should be noted that the flattening process by CMP is less likely to generate the unevenness in the polysilicon layer 12, and therefore, it is possible to perform the flattening process with an appropriate degree.

Figure 4:
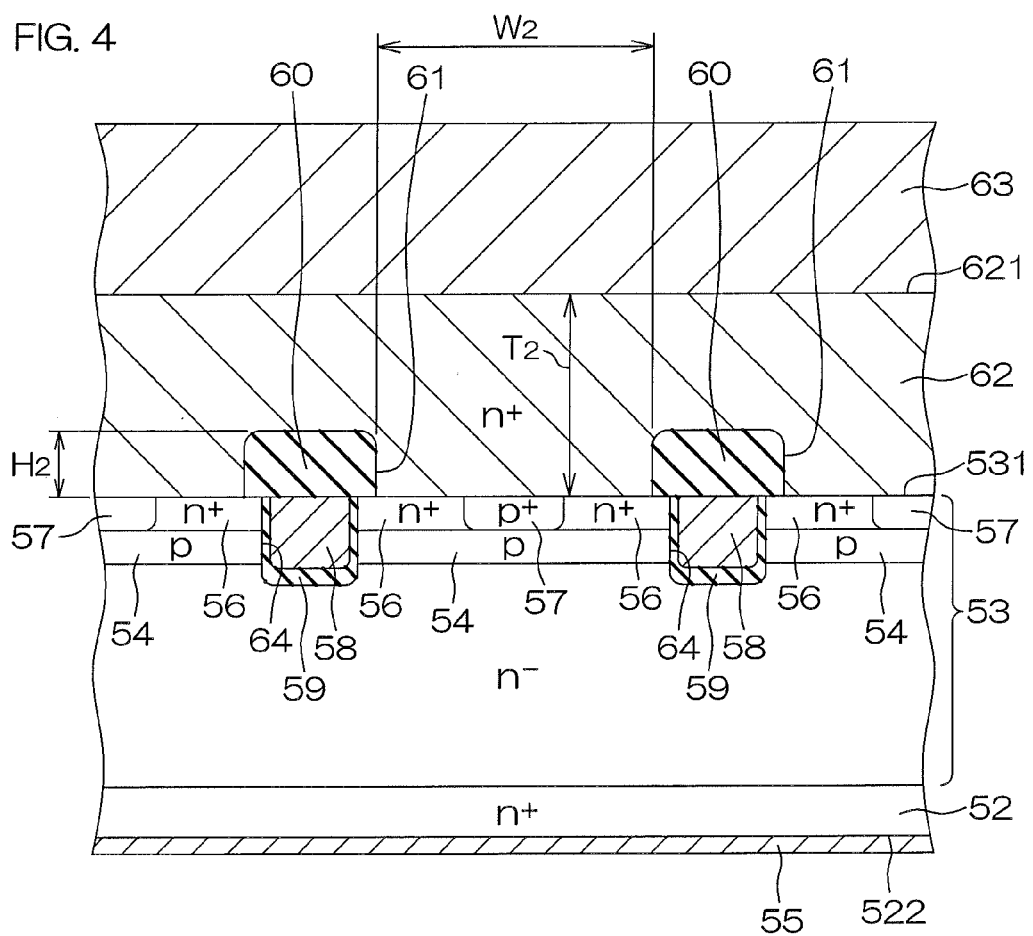
FIG. 4 is a schematic cross-sectional view of a semiconductor device according to a second embodiment of the present invention.

FIG. 4 is a schematic cross-sectional view of a semiconductor device according to a second embodiment of the present invention.

A semiconductor device 51 includes a power MOSFET element (semiconductor element) using SiC, and includes an SiC substrate 52 and an SiC epitaxial layer 53 formed on the SiC substrate 52, which act as an example of a semiconductor layer. Either conductive type of the SiC substrate 52 or the SiC epitaxial layer 53 is an n type, as a first conductive type. Specifically, the SiC substrate 52 is of $n^+$ type (the concentration is $1\times10^{18}$ to $1\times10^{21}$ cm$^{-3}$, for example), and the SiC epitaxial layer 53 is of $n^-$ type (the concentration is $1\times10^{15}$ to $1\times10^{17}$ cm$^{-3}$, for example) lower in concentration than the SiC substrate 52. The SiC epitaxial layer 53 is configured to function as a drain region (drift layer) of the field effect transistor.

On a surface 531 side of the SiC epitaxial layer 53, a p-type channel layer 54 is formed. Further, on a back surface 522 of the SiC substrate 52, a drain electrode 55 made of a nickel metal film, for example, is formed.

Within the p-type channel layer 54, an n$^+$-type source layer 56 that acts as an example of a first conductive type, and a p$^+$-type channel contact layer 57 which is surrounded by the n$^+$-type source layer 56 and acts as an example of a second conductive-type impurity region, are formed. The n$^+$-type source layer 56 and the p$^+$-type channel contact layer 57 are both exposed to the surface 531 of the SiC epitaxial layer 53.

On the surface 531 side of the SiC epitaxial layer 53, a gate trench 64 is formed which reaches the SiC epitaxial layer 53, which acts as the drain region, penetrating through the n$^+$-type source layer 56 and the p-type channel layer 54. The shape of the gate trench 64 may be a lattice, a stripe, a honeycomb, etc. By the gate trench 64, the p-type channel layer 54 is divided into a large number of cells arrayed in lattice, for example.

In the gate trench 64, the gate electrode 58 is embedded, and between the gate electrode 58 and the SiC epitaxial layer 53, a gate insulating film 59 is interposed. The gate electrode 58 crosses over the n$^+$-type source layer 56 and the SiC epitaxial layer 3 that acts as the drain region, and controls the formation of an inversion layer (channel) on the surface of the p-type channel layer 54 (side surface of the gate trench 64). That is, the semiconductor device 51 includes a so-called trench gate type structured MISFET.

Further, on the surface 531 of the SiC epitaxial layer 53, an interlayer film 60, as an example of an insulating film, made of silicon oxide, for example, is formed. In the interlayer film 60, a contact hole 61 is selectively formed in a central region of the p-type channel layer 54. The contact hole 61 is formed in a region allowing for selective exposure of one portion of the p$^+$-type channel contact layer 57 and the n$^+$-type source layer 56 therearound. Thus, when the surface 531 (flat surface) of the SiC epitaxial layer 53 is covered with the interlayer film 60 having the contact hole 61, on the topmost surface of the semiconductor device 51, an uneven shape is formed which is based on a height difference $H_2$ between the surface of the interlayer film 60 and the surface 531 of the SiC epitaxial layer 53 exposed to the contact hole 61. It should be noted that the "topmost surface" is a concept different from the surface 531 of the flat SiC epitaxial layer 53 (surface of a semiconductor portion), and includes a portion protruded or elevated as a result of the interlayer film 60, etc., being selectively formed on the surface 531.

A polysilicon layer 62 as an example of an unevenness buffer layer is formed to enter into the contact hole 61. The polysilicon layer 62 backfills the contact hole 61, and is formed with a thickness $T_2$ by which the interlayer film 60 is hidden. It is preferable that the specific thickness $T_2$ is ⅔ or more of a maximum width $W_2$ of the contact hole 61. It should be noted that in the embodiment, the contact hole 61 is formed with a constant diameter in a depth direction, and therefore, when the maximum width $W_2$ is measured, the contact hole 61 may be measured at any particular depth position. In the present embodiment, the polysilicon layer 62 uniquely is of n$^+$ type, and within the contact hole 61, is collectively connected to the n$^+$-type source layer 56 and the p$^+$-type channel contact layer 57. The polysilicon layer 62 includes a flat surface 621. Any surface 621 may be acceptable as long as it is smoother than the uneven shape based on the height difference $H_2$. For example, it may be possible that a recessed portion shallower than the height difference $H_2$ is selectively formed in the surface 621 and a minute uneven shape is formed by the recessed portion.

On the surface 621 of the polysilicon layer 62, a source electrode 63 (made of a metal material such as aluminum) as an example of a surface electrode is formed. The source electrode 63 is electrically connected via the polysilicon layer 62 to the n$^+$-type source layer 56 and the p$^+$-type channel contact layer 57. Therefore, the n$^+$-type source layer 56 is the same in electrical potential as the source electrode 63. The p-type channel layer 54 is connected via the p$^+$-type channel contact layer 57 to the source electrode 63, and therefore, the same in electrical potential as the source electrode 63.

Thus, in the semiconductor device 51 as well, it is possible to achieve the effect and operation in much the same way as in the foregoing semiconductor device 1.

Figure 5:
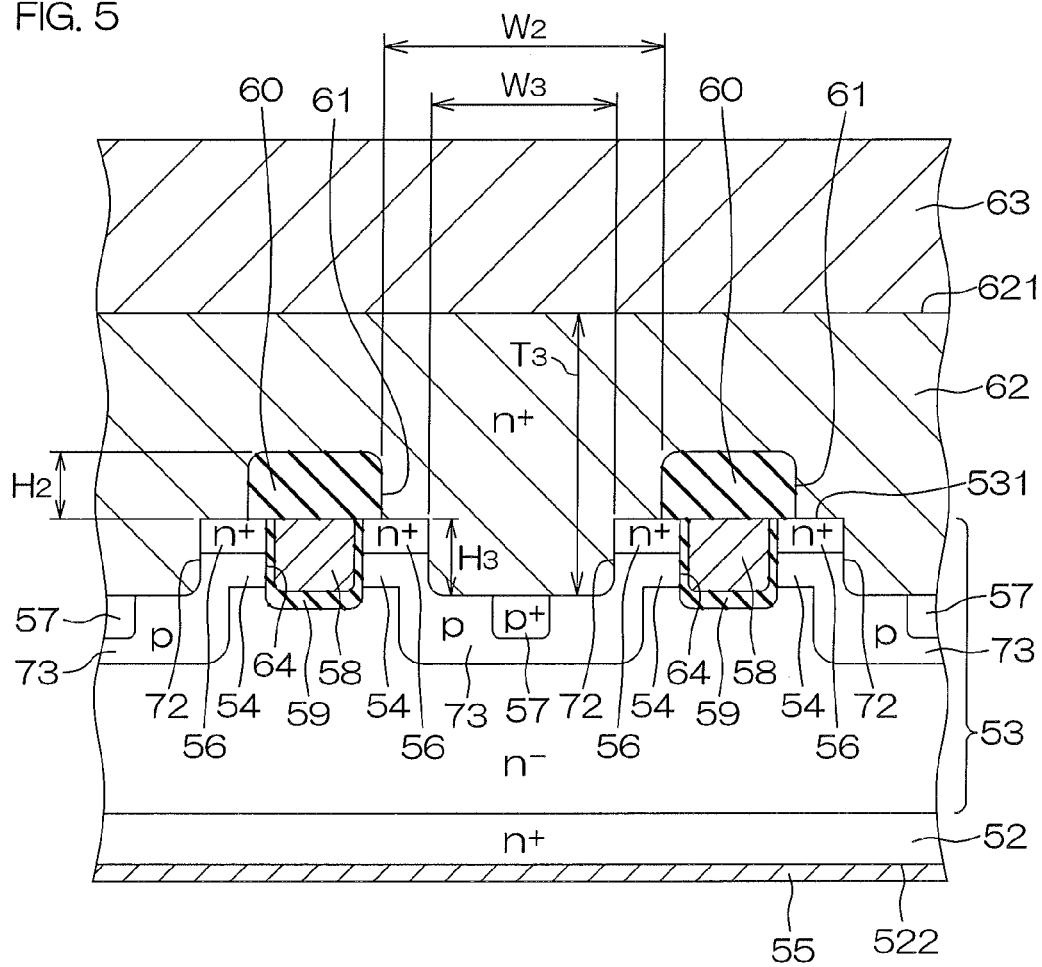
FIG. 5 is a schematic cross-sectional view of a semiconductor device according to a third embodiment of the present invention.

FIG. 5 is a schematic cross-sectional view of a semiconductor device according to a third embodiment of the present invention. In FIG. 5, portions corresponding to each portion shown in the foregoing FIG. 4 are assigned identical reference symbols.

In a semiconductor device 71, in a center portion of each p-type channel layer 54 divided by the gate trench 64, a source trench 72 is formed which reaches the drift layer to penetrate the n$^+$-type source layer 56 and the p-type channel layer 54. Thus, in addition to the uneven shape based on the height difference $H_{er}$ on the topmost surface of the semiconductor device 71, an uneven shape which is based on a height difference $H_3$ between the surface 531 of the SiC epitaxial layer 53 and the bottom surface of the source trench 72 is further formed. The n$^+$-type source layer 56 and the p-type channel layer 54 are exposed to a side surface of the source trench 72.

In the semiconductor device 71, a bottom portion p-type layer 73 is formed on the bottom surface and the side surface of the source trench 72 so that the SiC epitaxial layer 53 for acting as the drain region exposed to the source trench 72 is hidden below the p-type channel layer 54. The bottom portion p-type layer 73 is continued to the p-type channel layer 54 on the side surface of the source trench 72. Further, within the bottom portion p-type layer 73, a p$^+$-type channel contact layer 57 exposed to the bottom surface of the source trench 72 is formed. In the embodiment, the p$^+$-type channel contact layer 57 is formed in a center portion of the bottom surface of the source trench 72, and the bottom portion p-type layer 73 is formed to surround the p$^+$-type channel contact layer 57.

The polysilicon layer 62 is formed to enter into the source trench 72 and the contact hole 61. The polysilicon layer 62 backfills the source trench 72 and the contact hole 61, and is further formed with a thickness $T_3$ by which the interlayer film 60 is hidden. It is preferable that the specific thickness $T_3$ is ⅔ or more of a maximum width of the uneven shape. In the present embodiment, it is preferable that a width $W_2$ of the contact hole 61>a width $W_3$ of the source trench 72, and therefore, the thickness $T_3$ is ⅔ or more of the width $W_2$. The polysilicon layer 62 is connected to the n$^+$-type source layer 56 on the surface 531 of the SiC epitaxial layer 53 and the side surface of the source trench 72, and is connected to the p$^+$-type channel contact layer 57 on the bottom surface of the source trench 72.

Thus, in the semiconductor device 71 as well, it is possible to achieve the effect and operation in much the same way as in the foregoing semiconductor device 1.

Figure 6:
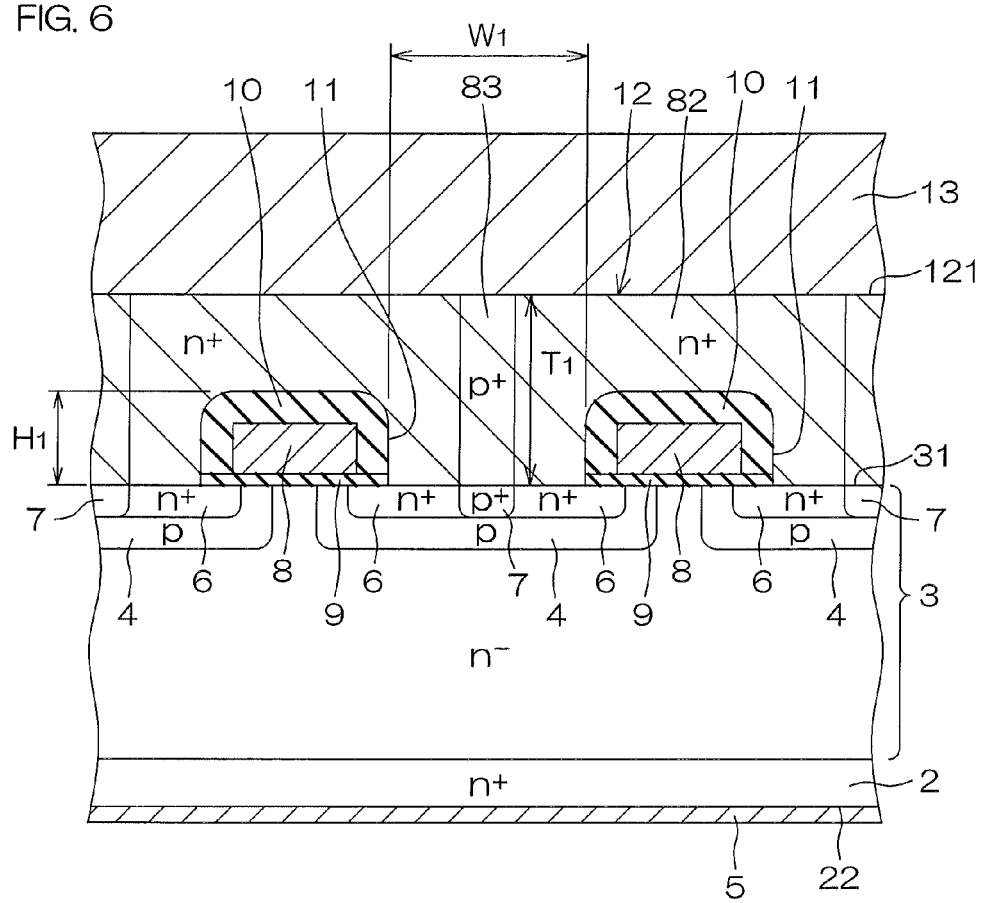
FIG. 6 is a schematic cross-sectional view of a semiconductor device according to a fourth embodiment of the present invention.
Figure 7:
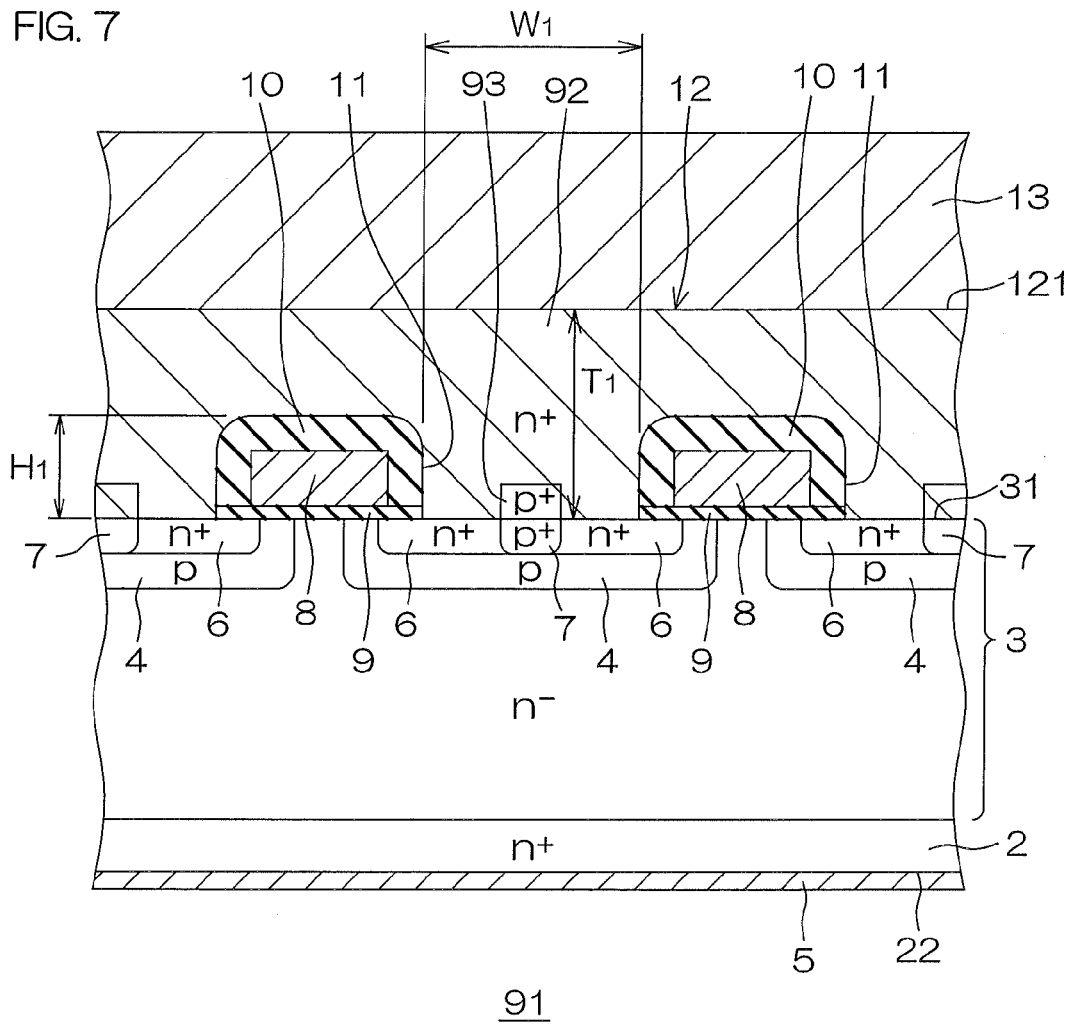
FIG. 7 is a schematic cross-sectional view of a semiconductor device according to a fifth embodiment of the present invention.

FIG. 6 to FIG. 9 are schematic cross-sectional views of semiconductor devices according to a fourth embodiment to a seventh embodiment of the present invention. In FIG. 6 and FIG. 7, portions corresponding to each portion shown in the foregoing FIG. 1 are assigned identical reference symbols. Further, in FIG. 8 and FIG. 9, portions corresponding to each portion shown in the foregoing FIG. 5 are assigned identical reference symbols.

In the foregoing embodiments, the polysilicon layers 12 and 62 are uniformly of n⁺ type, and as shown in FIG. 6 to FIG. 9, an n⁺-type portion that acts as an example of a first conductive-type portion and a p⁺-type portion that acts as an example of a second conductive-type portion may be selectively provided.

For example, in semiconductor devices 81 and 91 in FIG. 6 and FIG. 7 having a planar gate type structured MISFET, the polysilicon layer 12 may include p⁺-type portions 83 and 93 in an inner region of the p⁺-type well contact region 7 and the other main portion may be n⁺-type portions 82 and 92. The n-type polysilicon is a substance capable of contacting an n-type SiC with a low contact resistance and the p-type polysilicon is a substance capable of contacting a p-type SiC with a low contact resistance. Therefore, it is possible to easily bring the both the n⁺-type source region 6 and the p⁺-type well contact region 7 in ohmic contact with the polysilicon layer 12 without forming silicide on the surface of the SiC epitaxial layer 3 (the n⁺-type source region 6 and the p⁺-type well contact region 7) by performing a treatment such as RTA (Rapid Thermal Anneal).

In an example in FIG. 6 and FIG. 7, the n⁺-type source region 6 contacts to surround the p⁺-type well contact region 7. When the p⁺-type portions 83 and 93 are formed in the inner region so as not to stick out from the p⁺-type well contact region 7, it is possible to prevent contact between the p⁺-type portions 83 and 93 and the n⁺-type source region 6, resulting in preventing the formation of a pn junction therebetween.

The p⁺-type portion may be formed to penetrate the polysilicon layer 12 into the thickness direction from the contact surface with the p⁺-type well contact region 7 to the surface 121 of the polysilicon layer 12, as in the p⁺-type portion 83 in FIG. 6, and may be formed from the contact surface with the p⁺-type well contact region 7 to a certain point in the thickness direction of the polysilicon layer 12, as in the p⁺-type portion 93 in FIG. 7. It is possible to divide the n⁺-type portions 82 and 92 and the p⁺-type portions 83 and 93 by selectively implanting an impurity after depositing the polysilicon (step S6), for example.

Figure 8:
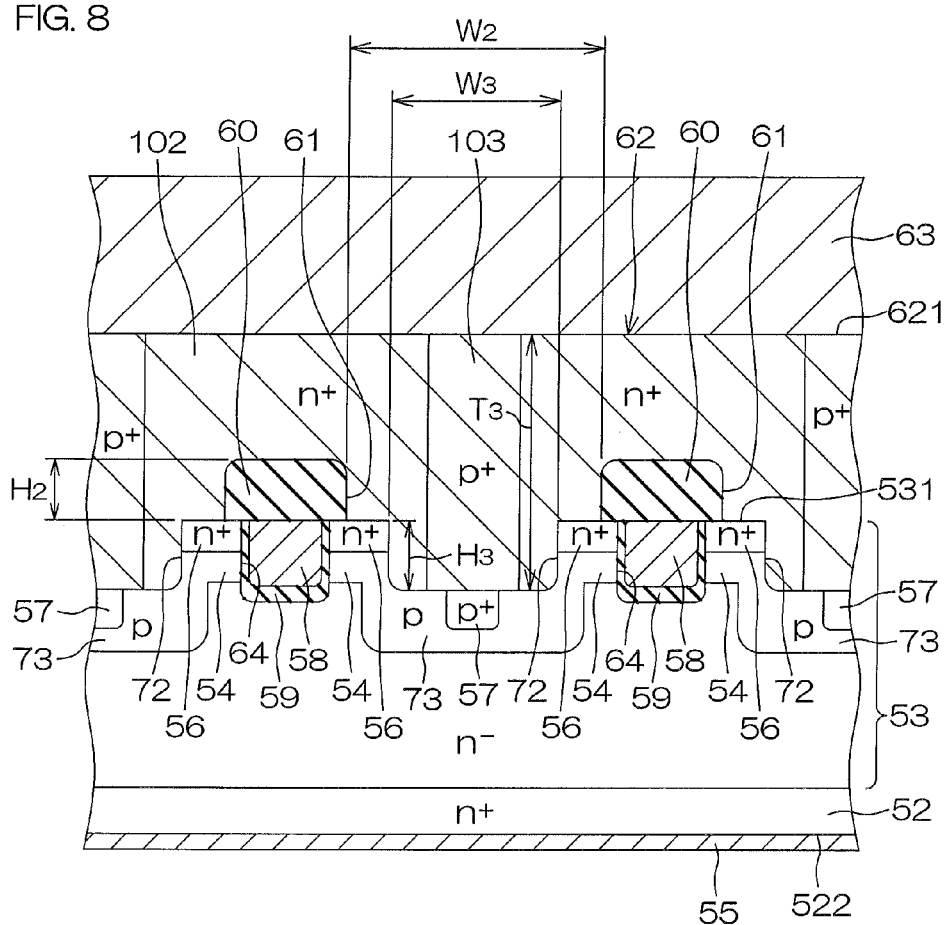
FIG. 8 is a schematic cross-sectional view of a semiconductor device according to a sixth embodiment of the present invention.
Figure 9:
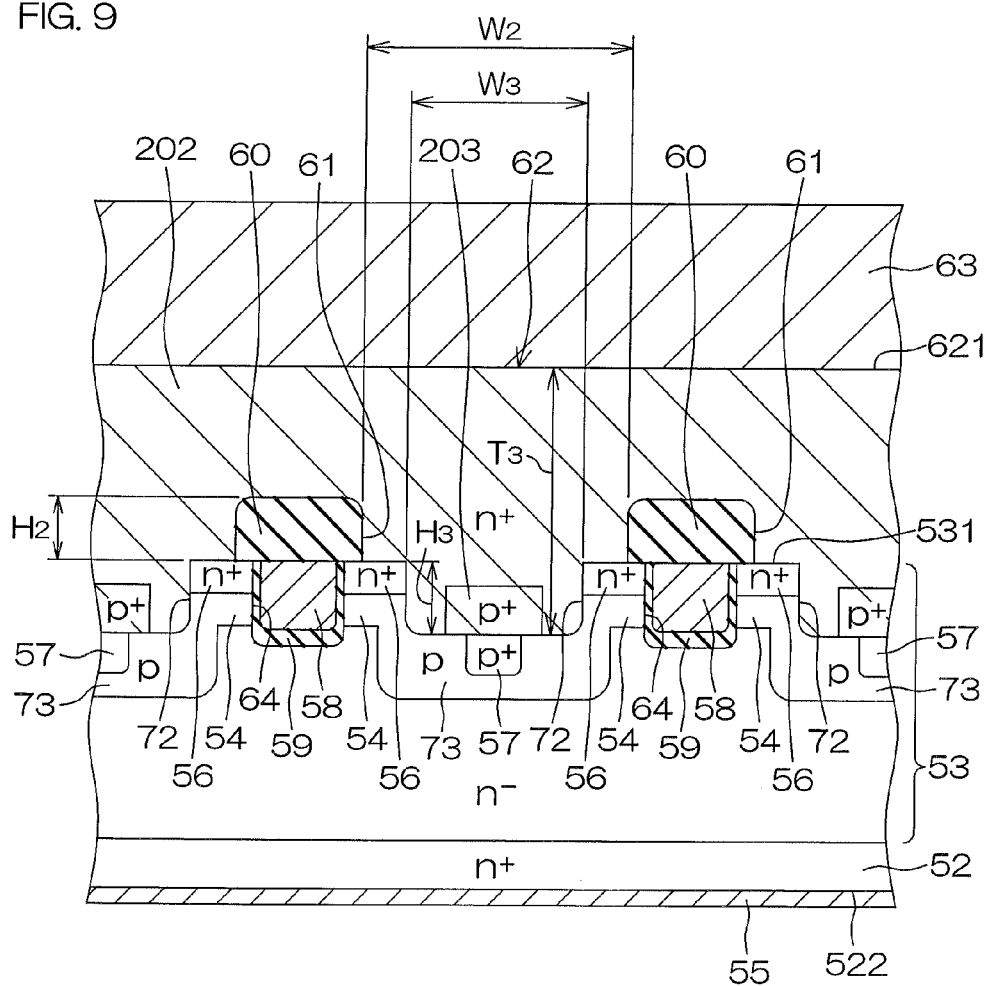
FIG. 9 is a schematic cross-sectional view of a semiconductor device according to a seventh embodiment of the present invention.

On the other hand, in semiconductor devices 101 and 201 in FIG. 8 and FIG. 9 having a trench gate type structured (with a source trench) MISFET, the polysilicon layer 62 may include p⁺-type portions 103 and 203 contacting the p⁺-type channel contact layer 57 so as to provide a gap with the side surface of the source trench 72, and the other main portion may be n⁺-type portions 102 and 202. The p⁺-type portions 103 and 203 may cover the entire p⁺-type channel contact layer 57, as shown in FIG. 8 and FIG. 9, may contact the bottom portion p-type layer 73 surrounding the p⁺-type channel contact layer 57, and may be formed only in the inner region of the p⁺-type channel contact layer 57. The effect and operation by the p⁺-type portions 103 and 203 and the n⁺-type portions 102 and 202 can be similarly provided as in the example in FIG. 6 and FIG. 7.

In the example in FIG. 8 and FIG. 9, the p⁺-type channel contact layer 57 is formed on the bottom surface of the source trench 72, and the interval provided between the n⁺-type source layer 56. Further, the bottom portion p-type layer 73 is formed over the entire bottom surface of the source trench 72. Therefore, even when the p⁺-type portions 103 and 203 stick out from the p⁺-type channel contact layer 57, unless the p⁺-type portions 103 and 203 contact the side surface of the source trench 72 (the n⁺-type source layer 56), the bottom portion p-type layer 73 of the same p type is contacted, which poses no particular problem. Thus, it may be possible that the p⁺-type portions 103 and 203 slightly shift laterally along the surface 531 of the SiC epitaxial layer 53, and therefore, it is possible to ensure a wide positioning margin when forming the p⁺-type portions 103 and 203.

Further, the p⁺-type portion may be formed to penetrate the polysilicon layer 62 into the thickness direction from the contact surface with the p⁺-type channel contact layer 57 to the surface 621 of the polysilicon layer 62, as in the p⁺-type portion 103 in FIG. 8, and may be formed from the contact surface with the p⁺-type channel contact layer 57 to a certain point in the thickness direction of the polysilicon layer 62, as in the p⁺-type portion 203 in FIG. 9. It is possible to divide the n⁺-type portions 102 and 202 and the p⁺-type portions 103 and 203 by selectively implanting an impurity after depositing the polysilicon (step S6), for example.

Although the embodiments of the present invention have heretofore been described, the present invention can be further embodied in other forms.

For example, an arrangement may be adopted in which the conductive type of each of the semiconductor portions of the foregoing semiconductor devices 1, 51, 71, 81, 91, 101, and 201 is inverted. For example, in the semiconductor device 1, the p-type portions may be n type and the n-type portions may be p-type.

The unevenness buffer layer that buffers the uneven shape on the topmost surface of the SiC epitaxial layers 3 and 53 may be a layer made not only of polysilicon but also of tungsten (W), etc.

Further, the contact holes 11 and 61 of the interlayer films 10 and 60 may not necessarily be opened vertically to the surfaces 31 and 531 of the SiC epitaxial layers 3 and 53, and may be opened in a tapered shape widening toward the surface of the interlayer films 10 and 60 or opened in a tapered shape narrowing theretoward.

Further, the semiconductors adopted in the semiconductor devices 1, 51, 71, 81, 91, 101, and 201 may not only be SiC but also be Si, GaN, diamond, etc.

Further, in the foregoing embodiments, description proceeds with an example where the present invention is applied to the power MOSFET, however, the present invention may be similarly applied to IGBT (Insulated Gate Bipolar Transistor), JFET (Junction Field Effect Transistor), and a semiconductor device having another structure.

In addition, it is possible to make various design changes within the scope of the features described in claims.

REFERENCE SIGNS LIST

1 Semiconductor device
2 SiC substrate
3 SiC epitaxial layer
31 Surface
4 p-type well
6 n⁺-type source region
7 p⁺-type well contact region
8 Gate electrode
9 Gate insulating film
10 Interlayer film
11 Contact hole
12 Polysilicon layer
121 Surface
13 Source electrode
51 Semiconductor device
52 SiC substrate
53 SiC epitaxial layer 531 Surface
54 p-type channel layer
56 n⁺-type source layer
57 p⁺-type channel contact layer
58 Gate electrode
59 Gate insulating film
60 Interlayer film
61 Contact hole
62 Polysilicon layer
621 Surface
63 Source electrode
71 Semiconductor device
72 Source trench
81 Semiconductor device
82 n⁺-type portion
83 p⁺-type portion
91 Semiconductor device
92 n⁺-type portion
93 p⁺-type portion
101 Semiconductor device
102 n⁺-type portion
103 p⁺-type portion
201 Semiconductor device
202 n⁺-type portion
203 p⁺-type portion

The invention claimed is:

1. A semiconductor device comprising:
a semiconductor layer on which a semiconductor element is disposed;
a wiring layer formed on or in the semiconductor layer;
an interlayer film formed on the wiring layer, the interlayer film cooperating with the semiconductor layer to form an uneven shape;
an unevenness buffer layer with a conductive property formed on an upper surface of the interlayer film and a surface of the semiconductor layer such that the unevenness buffer layer is in continuous contact with the upper surface of the interlayer film and the surface of the semiconductor layer, the unevenness buffer layer having a smoother surface than the uneven shape and being electrically connected to a part of the semiconductor element; and
a surface electrode including a metal material over the unevenness buffer layer, the surface electrode having a smoother surface than the uneven shape.

2. The semiconductor device according to claim 1, wherein
the interlayer film has a contact hole allowing the surface of the semiconductor layer to be selectively exposed, and
the uneven shape is formed on the basis of a height difference between the upper surface of the interlayer film and the surface of the semiconductor layer.

3. The semiconductor device according to claim 1, wherein the uneven shape includes a shape that is formed on the basis of a height difference between a bottom surface of a trench formed toward a back surface from the surface of the semiconductor layer and the surface of the semiconductor layer.

4. The semiconductor device according to claim 1, wherein the unevenness buffer layer includes a polysilicon layer.

5. The semiconductor device according to claim 4, wherein a thickness T of the polysilicon layer is ⅔ or more of a maximum width W of a recess of the uneven shape.

6. The semiconductor device according to claim 5, wherein
the semiconductor layer includes an SiC layer in which a first conductive-type impurity region is selectively formed, and
the polysilicon layer selectively includes a first conductive-type portion contacting the first-conductive type impurity region.

7. The semiconductor device according to claim 6, wherein
the SiC layer further includes a selectively formed second conductive-type impurity region, and
the polysilicon layer selectively further includes a second conductive-type portion contacting the second conductive-type impurity region.

8. A semiconductor device comprising:
a semiconductor layer made of first conductive-type SiC;
a first conductive-type source layer formed in a manner to be exposed to the surface of the semiconductor layer;
a second conductive-type channel layer formed in a manner contacting the source layer, at a back surface side of the semiconductor layer relative to the source layer;
a first conductive-type drift layer formed in a manner contacting the channel layer at a back surface side of the semiconductor layer relative to the channel layer;
an interlayer film having a contact hole that is formed on the surface of the semiconductor layer and that allows the source layer to be selectively exposed;
a polysilicon layer that is formed on an upper surface of the interlayer film and a surface of the source layer such that the polysilicon layer is in continuous contact with the upper surface of the interlayer film and the surface of the source layer, the polysilicon layer having a smoother surface than an uneven shape formed on the basis of a height difference between the surface of the interlayer film and the surface of the semiconductor layer exposed to the contact hole; and
a source electrode including a metal material formed on the polysilicon layer.

9. The semiconductor device according to claim 8, wherein the polysilicon layer selectively includes a first conductive-type portion contacting the source layer.

10. The semiconductor device according to claim 9, wherein
the channel layer includes a second conductive-type channel contact layer that is exposed to the surface of the semiconductor layer and that is higher in concentration than other portions in the channel layer, and
the polysilicon layer further includes a second conductive-type portion contacting the channel contact layer.

11. The semiconductor device according to claim 8, having a trench gate type structure including a gate trench that penetrates through the source layer and the channel layer from the surface of the semiconductor layer to reach the drift layer, a gate insulating film formed on a side surface and a bottom surface of the gate trench, and a gate electrode embedded in the gate trench.

12. The semiconductor device according to claim 8, having
a planar gate type structure including a gate insulating film formed on the surface of the semiconductor layer and a gate electrode formed on the gate insulating film.

13. The semiconductor device according to claim 8, further comprising;
a source trench that penetrates through the source layer and the channel layer from the surface of the semiconductor layer to reach the drift layer, wherein the uneven shape includes unevenness formed on the basis of a height difference between a bottom surface of the source trench and the surface of the semiconductor layer.

14. A method of manufacturing a semiconductor device, comprising:
   a step of forming a semiconductor element by selectively forming a predetermined impurity layer on a surface of a semiconductor layer;
   a step of forming an insulating film on the surface of the semiconductor layer;
   a step of forming a contact hole allowing the impurity layer to be exposed by selectively removing the insulating film;
   a step of forming a polysilicon layer by backfilling the contact hole and depositing polysilicon until the deposited surface is smoother than an uneven shape formed on the basis of a height difference between the surface of the insulating film and the surface of the semiconductor layer exposed to the contact hole; and
   a step of forming a surface electrode by depositing a metal material on the polysilicon layer,
   wherein the step of forming the surface electrode includes a step of depositing the metal material on the polysilicon layer left unprocessed after being deposited, without performing a flattening process on the deposited surface of the polysilicon layer.

15. The method of manufacturing a semiconductor device according to claim 14, wherein the step of forming the polysilicon layer includes a step of depositing polysilicon by an LPCVD method.

* * * * *